United States Patent
Iwasaki

(10) Patent No.: US 9,738,988 B2
(45) Date of Patent: Aug. 22, 2017

(54) METHOD FOR MANUFACTURING SINGLE CRYSTAL USING A GRAPHITE COMPONENT HAVING 30 PPB OR LESS NICKEL

(71) Applicant: SHIN-ETSU HANDOTAI CO., LTD., Tokyo (JP)

(72) Inventor: Atsushi Iwasaki, Echizen (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 377 days.

(21) Appl. No.: 14/350,269

(22) PCT Filed: Oct. 2, 2012

(86) PCT No.: PCT/JP2012/006288
§ 371 (c)(1),
(2) Date: Apr. 7, 2014

(87) PCT Pub. No.: WO2013/065232
PCT Pub. Date: May 10, 2013

(65) Prior Publication Data
US 2014/0238292 A1    Aug. 28, 2014

(30) Foreign Application Priority Data

Nov. 1, 2011   (JP) ................. 2011-240201

(51) Int. Cl.
*C30B 15/10* (2006.01)
*C30B 15/00* (2006.01)
*C30B 29/06* (2006.01)

(52) U.S. Cl.
CPC .............. *C30B 15/00* (2013.01); *C30B 15/10* (2013.01); *C30B 29/06* (2013.01)

(58) Field of Classification Search
CPC ......... C30B 15/00; C30B 15/02; C30B 15/10; C30B 15/20; C30B 29/02; C30B 29/06
(Continued)

(56) References Cited

U.S. PATENT DOCUMENTS 3,551,115 A * 12/1970 Jamieson ................ C30B 15/10
                                                       117/217
2002/0166503 A1* 11/2002 Magras ................... C30B 15/10
                                                       117/100
(Continued)

FOREIGN PATENT DOCUMENTS

CN    101168850 A    4/2008
CN    102057083 A    5/2011
(Continued)

OTHER PUBLICATIONS

Dec. 2, 2014 Office Action issued in Japanese Application No. 2011-240201.
(Continued)

*Primary Examiner* — Kenneth A Bratland, Jr.
(74) *Attorney, Agent, or Firm* — Oliff PLC

(57) ABSTRACT

According to the present invention, there is provided a method for manufacturing single crystal based on a Czochralski method, including: analyzing Ni concentration in at least one of graphite components used in a furnace in which the single crystal is manufactured; and manufacturing the single crystal using the at least one of the graphite components when the analyzed Ni concentration is 30 ppb or less. As a result, in manufacture of the single crystal based on the Czochralski method, the method that enables manufacturing high-quality single crystal in which a reduction in LT (Life Time) or an LPD (Light Point Defect) abnormality does not occur can be provided.

2 Claims, 1 Drawing Sheet

(58) Field of Classification Search
USPC ........... 117/11, 13–14, 19, 30, 35, 900, 928, 117/931–932
See application file for complete search history.

(56) References Cited

U.S. PATENT DOCUMENTS

| | | |
|---|---|---|
| 2004/0040491 A1 | 3/2004 | Murakami et al. |
| 2008/0053368 A1 | 3/2008 | Inami et al. |
| 2011/0177626 A1* | 7/2011 | Depesa ................. C01B 33/021 438/14 |
| 2012/0103251 A1 | 5/2012 | Sakamoto et al. |
| 2012/0107222 A1 | 5/2012 | Yuki et al. |

FOREIGN PATENT DOCUMENTS

| | | | |
|---|---|---|---|
| JP | A-5-58770 | | 3/1993 |
| JP | 07-223895 | * | 8/1995 |
| JP | A-7-223895 | | 8/1995 |
| JP | 08-337493 | * | 12/1996 |
| JP | A-8-337493 | | 12/1996 |
| JP | 2004083346 | | 3/2004 |
| JP | 2011037653 A | | 2/2011 |

OTHER PUBLICATIONS

Oct. 28, 2015 Chinese Office Action issued in Chinese Patent Application No. 201280051969.0.
International Search Report issued in International Patent Application No. PCT/JP2012/006288 mailed Nov. 6, 2012.
International Preliminary Report on Patentability issued in PCT/JP2012/006288 mailed May 15, 2014.

* cited by examiner

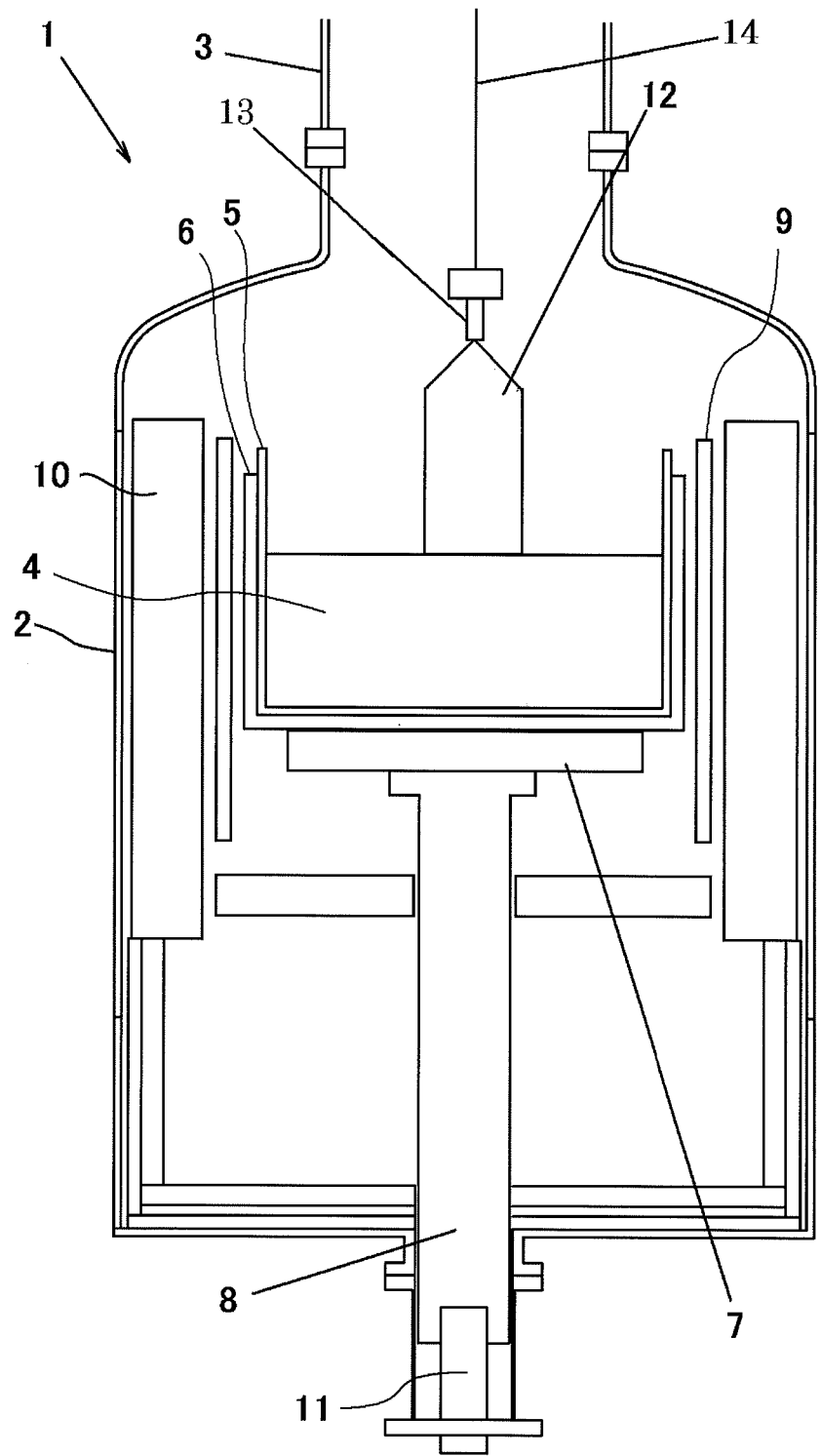

METHOD FOR MANUFACTURING SINGLE CRYSTAL USING A GRAPHITE COMPONENT HAVING 30 PPB OR LESS NICKEL

TECHNICAL FIELD

The present invention relates to a method for manufacturing single crystal based on a Czochralski method (which will be referred to as a Czochralski method hereinafter).

BACKGROUND ART

For example, as one of methods for manufacturing silicon single crystal, there is widely known the Czochralski method for melting a silicon polycrystalline raw material in a crucible, bringing seed crystal into contact with a melt surface, and pulling the seed crystal, thereby growing the single crystal.

In manufacture of the single crystal based on the Czochralski method, it is known that a metallic impurity of a quartz crucible that accommodates raw material polycrystalline serving as a melt and this melt affects defect density of single crystal to be manufactured. For example, in Patent Literature 1, a synthetic quartz crucible having small impurity content (Al, Fe, Ni, Cr, or the like) in a synthetic layer is used, and manufacturing single crystal with micro defects corresponding to 3/cm² or less.

CITATION LIST

Patent Literature

Patent Literature 1: Japanese Unexamined Patent Application Publication No. Hei 5-58770

SUMMARY OF THE INVENTION

Technical Problem

Further, in case of manufacturing single crystal, since impurities contained in a graphite component in a furnace affects an purity of the single crystal, an ultrahigh purity graphite material or a high purity graphite material is generally used as a graphite component in a furnace. Standards for concentrations (Fe, Al, Ni, Cr, and others) of these metallic impurities are approximate 0.3 ppm (300 ppb) in case of the ultrahigh purity graphite material and approximately 0.5 ppm (500 ppb) in case of the high purity graphite material.

In the prior art, when it comes to a graphite material meeting these standards, impurities in the graphite material do not affect single crystal. However, in recent years, multi-pulling (a method for pulling many pieces of single crystal from one crucible by recharging with a raw material) or the like of low-defect crystal that is allowed to grow at a low speed has increased a manufacturing time for manufacturing the single crystal to be twice or triple as high as that in the past, and impurities contained in a graphite material, especially impurities each having a high diffusion coefficient in graphite, quartz, and silicon diffuse outwards from the graphite material, then diffuse and pass through the quartz crucible containing a melt, are taken into the melt, segregated in the single crystal, and affect crystal quality of the single crystal.

Furthermore, when each impurity in the graphite material diffuses and is taken into the single crystal, a reduction in LT (Life Time) or an LPD (Light Point Defect) abnormality of the single crystal occurs.

Here, the LT represents a time which is measured by an optical attenuation method and in which minority carriers in the semiconductor crystal are excited by light and moved, and this value is lowered as metallic impurity concentration is increased. Further, as to the LPD, when an epitaxial layer is formed on a wafer obtained from single crystal and a surface of the epitaxial layer is measured by a particle counter, crystal defects each of which is 0.09 μm or more are observed, and the LPD is a generic term of these spot defects observed by a wafer surface inspection apparatus using laser beams.

In view of the above-described problems, it is an object of the present invention to provide a method that enables manufacturing single crystal in which a reduction in LT or an LPD abnormality does not occur in manufacture of the single crystal based on the Czochralski method.

Solution to Problem

To achieve the object, according to the present invention, there is provided a method for manufacturing single crystal based on a Czochralski method, comprising: analyzing Ni concentration in at least one of graphite components used in a furnace in which the single crystal is manufactured; and manufacturing the single crystal using the at least one of the graphite components when the analyzed Ni concentration is 30 ppb or less.

By using the graphite component whose analyzed Ni concentration is 30 ppb or less, the high-quality single crystal in which the reduction in LT or the LPD abnormality does not occur can be manufactured with good productivity.

At this time, it is preferable for the graphite components to include at least one of a graphite component that is directly in contact with a quartz crucible and a graphite component that is indirectly in contact with the quartz crucible through the graphite component that is directly in contact.

When the Ni concentration of such a graphite component is set to 30 ppb or less, diffusion of Ni into the melt in the quartz crucible can be efficiently avoided, and the reduction in LT or the LPD abnormality of the single crystal can be effectively prevented.

At this time, it is preferable for the graphite components to include a graphite crucible.

Such a graphite crucible is directly in contact with the quartz crucible that accommodates the melt, and hence setting the Ni concentration to 30 ppb or less enables more effectively avoiding the reduction in LT or the LPD abnormality of the single crystal.

At this time, it is preferable for the graphite components to further include at least one of a crucible receiver and a pedestal.

Moreover, when the Ni concentration of such a graphite component is set to 30 ppb or less, the reduction in LT or the LPD abnormality of the single crystal to be manufactured can be assuredly avoided.

At this time, it is preferable for the method for analyzing the Ni concentration to be a high-sensitivity analysis method for performing plasma ashing and acid-dissolving with respect to a graphite material in the graphite component and analyzing the resultant graphite material.

Such a high-sensitivity analysis method enables quantitatively analyzing the Ni concentration of the graphite material in the graphite component up to 30 ppb or less, and hence the reduction in LT or the LPD abnormality of the single crystal to be manufactured can be assuredly avoided.

Advantageous Effects of Invention

As described above, according to the present invention, it is possible to manufacture the high-quality single crystal, in which the reduction in LT or the LPD abnormality does not occur, with an improved yield.

BRIEF DESCRIPTION OF DRAWINGS

FIG. 1 is a schematic view showing an example of a single-crystal manufacturing apparatus that can be used for a manufacturing method according to the present invention.

DESCRIPTION OF EMBODIMENTS

The present inventor paid attention to a graphite component that is considered to be not a cause of a reduction in LT or an LPD abnormality, which occurs in single crystal manufactured by the Czochralski method, if the graphite component with a high impurity is used, and he conducted examinations as follows.

Raw material polycrystalline and a quartz crucible with very small impurity content were used, single crystal was manufactured, each graphite component used in manufacture of the single crystal was analyzed in both a situation where a reduction in LT or an LPD abnormality occurred in the single crystal and a situation where it did not occur in the same based on a high-sensitivity analysis method (a quantitive lower limit of Fe, Al, Ni, Cr, or the like is 5 to 10 ppb), and results were compared. As a result, he found out that the reduction in LT or the LPD abnormality occurs in single crystal manufactured by using a graphite component in which concentration of Ni, which is a metallic impurity that is contained in the graphite in high volume and has a high diffusion coefficient in the graphite, exceeds 30 ppb.

Here, a process that a metallic impurity in the graphite component is taken into the single crystal will now be described based on an example of a graphite crucible.

An impurity having a particularly high diffusion coefficient in impurities contained in the graphite crucible outwardly diffuses from the inside of a base material of the graphite crucible during long-time manufacture of single crystal, diffuses into quartz of a quartz crucible that is in contact with the graphite crucible, passes through the quartz crucible, and then is taken into a melt. Additionally, the impurity is segregated in growing single crystal from the melt, and the reduction in LT or the LPD abnormality occurs in crystal quality of the manufactured single crystal.

Even a metallic impurity having high diffusion coefficients in the graphite material and the quartz material takes a very long time to be taken from the graphite crucible to the quartz crucible and further to the melt. Therefore, in single crystal manufacture based on multi-pulling for pulling two pieces of single crystals in low-speed growth or single crystal manufacture based on multi-pulling for pulling up to three pieces of single crystal in high-speed growth, a time until an impurity is taken into the growing single crystal is not reached, and hence the reduction in LT or the LPD abnormality hardly occurs due to the impurity in the graphite component. Therefore, the manufacturing method according to the present invention is preferable for the multi-pulling for pulling a plurality of pieces of single crystal from the same crucible while performing recharge of the raw material, and it is particularly preferable for the multi-pulling for pulling three or more pieces of single crystal in low-speed growth or that for pulling four or more pieces of single crystal in high-speed growth.

Since Ni has a high diffusion coefficient in each of the graphite material and the quartz material among the metallic impurities in the graphite component, and a high concentration in the graphite material, using the graphite component having concentration exceeding 30 ppb affects the crystal quality as described above.

Although the present invention will now be described as an embodiment hereinafter in detail with reference to the drawings, the present invention is not restricted thereto.

FIG. 1 is a schematic view showing a single-crystal manufacturing apparatus that can be used in the manufacturing method according to the present invention.

In a single-crystal manufacturing apparatus 1 in FIG. 1, a furnace is constituted of a main chamber 2 and a pull chamber 3 coupled with an upper portion of the main chamber 2. A quartz crucible 5 that accommodates a melt 4 and a graphite crucible 6 that supports the quartz crucible 5 are arranged in the main chamber 2. The crucibles 5, 6 are supported by a support shaft 11 that can freely rotate and move up and down by a rotary drive mechanism (not shown) disposed to a lower portion of the single-crystal manufacturing apparatus 1. The support shaft 11 that is usually made of a metal is used. Further, a pedestal 8 made of graphite as a base of the crucibles 5, 6 is coupled with the support shaft 11, and the crucibles 5, 6 are supported by the pedestal 8 through a crucible receiver 7 made of graphite.

Furthermore, a heater 9 that surrounds the crucibles 5, 6 and heats the melt 4 and a heat insulating member 10 arranged between the heater 9 and an inner wall of the main chamber 2 are provided.

A pulling shaft (a wire, a shaft, or the like) 14 for pulling seed crystal 13 is provided above the crucibles 5, 6.

According to the present invention, in case of manufacturing single crystal by using the above-described single-crystal manufacturing apparatus, Ni concentration in at least one of graphite components used in the furnace where the single crystal is manufactured is analyzed, and the single crystal using the at least one of the graphite components when the analyzed Ni concentration is 30 ppb or less is manufactured.

When the graphite component whose Ni concentration exceeds 30 ppb is used, Ni is mixed into the single crystal to be manufactured, resulting in the reduction in LT or the LPD abnormality. Therefore, by using the graphite component whose previously analyzed Ni concentration is 30 ppb or less, the high-quality single crystal in which the reduction in LT or the LPD abnormality does not occur can be manufactured with good productivity.

Here, the graphite component that is subjected to Ni concentration analysis and then used is not restricted in particular, and all graphite components can be selected, but a problem occurs in terms of cost. Therefore, it is preferable to determine, as the graphite component that is subjected to Ni concentration analysis and then used in the present invention, at least one of a graphite component that is directly in contact with the quartz crucible 5 and a graphite component that is indirectly in contact with the quartz crucible 5 through the graphite component that is directly in contact. For example, as shown in FIG. 1, it is preferable to analyze the graphite crucible 6 that is directly in contact with the quartz crucible 5 and more preferable to analyze at least one of the crucible receiver 7 and the pedestal 8 that are indirectly in contact with the quartz crucible 5 through the graphite crucible 6.

Graphite materials are used for the graphite crucible, the crucible receiver, and the pedestal, these members are close to the quartz crucible accommodating the melt, Ni diffuses and is easily taken into the melt, and hence the reduction in LT or the LPD abnormality can be effectively avoided by using each component whose analyzed Ni concentration is 30 ppb or less. In this case, the order of priority of needs for setting the Ni concentration to 30 ppb or less is the graphite crucible, the crucible receiver, and the pedestal. As a matter of course, to further securely avoid the reduction in LT or the LPD abnormality, it is more preferable to analyze all of the graphite crucible 6, the crucible receiver 7, and the pedestal 8 and use each component whose Ni concentration is 30 ppb or less.

Additionally, the graphite components analyzed in the present invention may be other members than the graphite crucible 6, the crucible receiver 7, and the pedestal 8. Even graphite components other than the graphite crucible 6, the crucible receiver 7, and the pedestal 8 are used after analysis in the present invention, and hence each graphite component whose Ni concentration is 30 ppb or less is assuredly used, and a component contaminated with Ni can be prevented from being used as different from the prior art in which analysis is not conducted. Therefore, an effect for suppressing the reduction in LT or the LPD abnormality can be exercised. In particular, the effect can be exercised in each graphite component used immediately above the quartz crucible 5.

At this time, it is preferable to use, as the method for analyzing Ni concentration, a high-sensitivity analysis method for performing plasma ashing and acid-dissolving with respect to a graphite material in a graphite component and analyzing the resultant graphite material.

According to the prior art method for analyzing a graphite material in a graphite component, graphite is burnt and ashed and then subjected to an acid treatment, a resultant material dissolved by the acid is analyzed, and hence a quantitive lower limit of each metallic impurity (Fe, Al, Ni, Cr, or the like) is 50 to 100 ppb, whereby concentration of 50 to 100 ppb or less cannot be measured. Such an analysis method provides a quantitive lower limit that is sufficient for standards (approximately 300 ppb in case of an ultrahigh purity graphite material, approximately 500 ppb in case of a high purity graphite material) of metal impurity concentration (Fe, Al, Ni, Cr, or the like) of a conventional graphite component. However, according to such a prior art method, it is impossible to analyze Ni concentration of 30 ppb or less with which the reduction in LT or the LPD abnormality does not occur.

On the other hand, a quantitive lower limit of the Ni concentration in the above-described high-sensitivity analysis method is 5 ppb, whether the concentration is 30 ppb or less can be accurately determined, and the manufacturing method according to the present invention can be assuredly implemented. However, an analysis method that a quantitive lower limit of the Ni concentration is 30 ppb or less can be used for the present invention, and the method is not restricted to the above-described one.

It is to be noted that the graphite component whose Ni concentration is 30 ppb or less can be obtained by processing a graphite material whose Ni concentration is 30 ppb or less and fabricating the graphite component, but the Ni concentration can be set to 30 ppb or less by performing a heat treatment or the like to enhance purity after processing the graphite material to obtain the graphite component. That is, the Ni concentration of the obtained graphite component that is 30 ppb or less can suffice.

Further, the graphite component whose analyzed Ni concentration is 30 ppb or less is used, and single crystal is manufactured as follows, for example.

The polycrystalline raw material filling the quartz crucible 5 is heated by the heater 9 to provide the melt 4, the seed crystal 13 is immersed in this melt 4, and single crystal (an ingot) 12 is grown at a lower end of the seed crystal 13 while pulling the seed crystal 13 using a pulling shaft 14. At this time, in case of a Magnetic Field Applied Czochralski method, it is possible to grow the single crystal 12 while applying a magnetic field to the melt 4.

At this time, in case of performing the multi-pulling, one piece of single crystal 12 is pulled, then the quartz crucible 5 is recharged with the polycrystalline raw material, thereby manufacturing the single crystal in the same manner. The multi-pulling that such pulling of the single crystal is repeated enables manufacturing a plurality of pieces of single crystal from the quartz crucible, which can be used only once and cannot be reused, improving a production yield, and reducing a cost of the quartz crucible.

According to the above-described present invention, in case of performing long-time manufacture of three or more pieces of single crystal, especially performing the multi-pulling in low-speed growth, as to the single crystal that is the third or subsequent piece to be pulled, it is possible to manufacture the single crystal with good crystal quality in which the reduction in LT or the LPD abnormality does not occur.

EXAMPLES

Although the present invention will now be more specifically described hereinafter based on examples and comparative examples, the present invention is not restricted thereto.

Examples 1-3

Manufacture of single crystal based on the multi-pulling (pulling five pieces) was carried out by using a single-crystal manufacturing apparatus adopting a graphite crucible whose Ni concentration is 15 ppb to 30 ppb, Fe concentration is 45 ppb to 131 ppb, and Cr concentration is 35 ppb to 118 ppb as a result of analyzing impurity concentrations based on the high-sensitivity analysis method.

An LT and an LPD were inspected with respect to each manufactured single crystal, a reduction in LT value and an LPD abnormality were not observed in each single crystal that was the third or subsequent pulled piece. Tables 1 and 2 show the results.

Comparative Examples 1-3

Manufacture of single crystal based on the multi-pulling (pulling five pieces) was carried out by using a single-crystal manufacturing apparatus adopting a graphite crucible whose Ni concentration is 38 ppb to 48 ppb, Fe concentration is 18 ppb to 125 ppb, and Cr concentration is 15 ppb to 133 ppb as a result of analyzing impurity concentrations based on the high-sensitivity analysis method.

An LT and an LPD were inspected with respect to each manufactured single crystal, a reduction in LT value and an LPD abnormality were observed in each single crystal that was the third or subsequent pulled piece in particular. Tables 1 and 2 show the results.

TABLE 1

| Examples and Comparative Examples | Concentrations in graphite crucible (ppb) | | | LT (μsec) | | | | |
|---|---|---|---|---|---|---|---|---|
| | Fe | Ni | Cr | First | Second | Third | Fourth | Fifth |
| Example 1 | 131 | 15 | 35 | 710 | 690 | 700 | 670 | 680 |
| Example 2 | 45 | 26 | 118 | 710 | 700 | 680 | 690 | 670 |
| Example 3 | 98 | 30 | 104 | 720 | 720 | 700 | 690 | 680 |
| Comparative Example 1 | 22 | 48 | 133 | 710 | 690 | 420 | 380 | 300 |
| Comparative Example 2 | 125 | 39 | 22 | 730 | 680 | 490 | 420 | 310 |
| Comparative Example 3 | 18 | 38 | 15 | 720 | 680 | 480 | 400 | 320 |

TABLE 2

| Examples and Comparative Examples | Concentrations in graphite crucible (ppb) | | | LPD (quantity/cm²) | | | | |
|---|---|---|---|---|---|---|---|---|
| | Fe | Ni | Cr | First | Second | Third | Fourth | Fifth |
| Example 1 | 131 | 15 | 35 | 0 | 0 | 2 | 5 | 3 |
| Example 2 | 45 | 26 | 118 | 0 | 0 | 0 | 2 | 5 |
| Example 3 | 98 | 30 | 104 | 0 | 0 | 0 | 2 | 4 |
| Comparative Example 1 | 22 | 48 | 133 | 0 | 0 | 40 | 120 | 185 |
| Comparative Example 2 | 125 | 39 | 22 | 0 | 2 | 30 | 95 | 150 |
| Comparative Example 3 | 18 | 38 | 15 | 0 | 0 | 25 | 45 | 120 |

Examples 4-6

Manufacture of single crystal based on the multi-pulling (pulling five pieces) was carried out by using a single-crystal manufacturing apparatus adopting a graphite crucible whose Ni concentration is 19 ppb to 30 ppb, a crucible receiver whose Ni concentration is 23 ppb to 29 ppb, and a pedestal whose Ni concentration is 22 ppb to 30 ppb as a result of analyzing the Ni concentrations based on the high-sensitivity analysis method.

An LT and an LPD were inspected with respect to each manufactured single crystal, a reduction in LT value and an LPD abnormality were not observed in each single crystal that was the third or subsequent pulled piece. Tables 3 and 4 show the results.

TABLE 3

| Examples | Ni concentration (ppb) | | | LT (μsec) | | | | |
|---|---|---|---|---|---|---|---|---|
| | Graphite crucible | Crucible receiver | Pedestal | First | Second | Third | Fourth | Fifth |
| Example 4 | 30 | 29 | 28 | 700 | 690 | 670 | 680 | 680 |
| Example 5 | 21 | 28 | 30 | 740 | 720 | 680 | 690 | 670 |
| Example 6 | 19 | 23 | 22 | 710 | 710 | 710 | 690 | 680 |

TABLE 4

| Examples | Ni concentration (ppb) | | | LPD (quantity/cm²) | | | | |
|---|---|---|---|---|---|---|---|---|
| | Graphite crucible | Crucible receiver | Pedestal | First | Second | Third | Fourth | Fifth |
| Example 4 | 30 | 29 | 28 | 0 | 0 | 0 | 2 | 3 |
| Example 5 | 21 | 28 | 30 | 0 | 1 | 1 | 2 | 4 |
| Example 6 | 19 | 23 | 22 | 0 | 0 | 0 | 1 | 2 |

As can be understood from Tables 1 and 2, the reduction in LT and the LPD abnormality are dependent on the Ni concentration in the graphite, and the reduction in LT and the LPD abnormality are suppressed when the Ni concentration is 30 ppb or less. The reduction in LT and the LPD abnormality are effectively suppressed by just setting the Ni concentration in the graphite crucible to 30 ppb or less. Further, as can be understood from Tables 3 and 4, the reduction in LT and the LPD abnormality are further suppressed by setting the Ni concentrations in all of the graphite crucible, the crucible receiver, and the pedestal to 30 ppb or less.

It is to be noted that the present invention is not restricted to the foregoing embodiment. The foregoing embodiment is just an illustrative example, and any example that has substantially the same configuration and exercises the same functions and effects as the technical concept described in claims of the present invention is included in the technical scope of the present invention.

The invention claimed is:

1. A method for manufacturing a plurality of pieces of single crystal based on a Czochralski method, comprising:
    analyzing Ni concentration in graphite components used in a furnace in which the single crystal is manufactured; and
    manufacturing the plurality of pieces of single crystal by multi-pulling using the graphite components when the analyzed Ni concentration is 30 ppb or less,
    wherein a quantitative lower limit for measurement of an impurity is 5 to 10 ppb in the step of analyzing Ni concentration;
    the graphite components having a Ni concentration of 30 ppb or less include both a graphite component that is directly in contact with a quartz crucible and a graphite component that is indirectly in contact with the quartz crucible through the graphite component that is directly in contact;
    the graphite component that is directly in contact with the quartz crucible includes a graphite crucible; and
    the graphite component that is indirectly in contact with the quartz crucible through the graphite component that is directly in contact includes both a crucible receiver and a pedestal.

2. The method for manufacturing single crystal according to claim 1, wherein the method for analyzing the Ni concentration is a high-sensitivity analysis method for performing plasma ashing and acid-dissolving with respect to a graphite material in the graphite component and analyzing the resultant graphite material, wherein a quantitative lower limit for measurement of an impurity is 5 to 10 ppb in the high-sensitivity analysis method.

\* \* \* \* \*